United States Patent [19]
Kim et al.

[11] Patent Number: 5,568,057
[45] Date of Patent: Oct. 22, 1996

[54] METHOD FOR PERFORMING A BURN-IN TEST

[75] Inventors: Gu Sung Kim, Kyungki-do; Jae Myung Park, Seoul, both of Rep. of Korea

[73] Assignee: Samsung Electronics Co., Ltd., Suwon, Rep. of Korea

[21] Appl. No.: 542,023

[22] Filed: Oct. 12, 1995

Related U.S. Application Data

[63] Continuation of Ser. No. 242,894, May 16, 1994, abandoned.

[30] Foreign Application Priority Data

May 14, 1993 [KR] Rep. of Korea .................. 93-8257

[51] Int. Cl.$^6$ ........................................ G01R 31/02
[52] U.S. Cl. ...................... 324/755; 324/754; 437/8
[58] Field of Search ................ 437/8, 209; 324/754, 324/755; 439/70, 71

[56] References Cited

U.S. PATENT DOCUMENTS

| | | | |
|---|---|---|---|
| 5,155,067 | 10/1992 | Wood | 437/209 |
| 5,180,976 | 1/1993 | Van-Loan | 324/755 |
| 5,215,472 | 6/1993 | DelPrete | 439/71 |
| 5,342,807 | 8/1994 | Kinsman | 437/209 |

*Primary Examiner*—Ernest F. Karlsen
*Assistant Examiner*—Russell M. Kobert
*Attorney, Agent, or Firm*—Cushman Darby & Cushman, L.L.P.

[57] ABSTRACT

An apparatus for burn-in test comprising, a socket body including an accommodation groove in which an integrated circuit chip is accommodated to be tested, a step sill portion formed around the accommodation groove, a plurality of inner leads formed on the step sill portion, a plurality of outer leads protruded from the socket body and electrically connected to said inner leads through the socket body, and a supporting element attached to opposite inside walls of the accommodation groove to support the integrated circuit chip, and a method for burn-in test comprising the steps of: (a) mounting an integrated circuit chip to be tested in the accommodation groove; (b) bonding pads of the integrated circuit chip with the corresponding inner leads through a plurality of wires; (c) mounting the socket body on a test board by the outer leads and applying test pattern signals to the integrated circuit chip through the inner and outer leads in the condition of high temperature and high voltage; and (d) severing and removing the wires.

10 Claims, 2 Drawing Sheets

METHOD FOR PERFORMING A BURN-IN TEST

This is a continuation of application Ser. No. 08/242,894, filed on May 16, 1994, now abandoned.

BACKGROUND OF THE INVENTION

1. Field of the Invention

The present invention relates to a burn-in test with an integrated circuit device, and more particularly to a socket and method for performing a burn-in test with various bare chips which have not yet encapsulated.

2. Description of the Prior Art

In the processing sequence of semiconductor device, It is very necessary for an integrated circuit (hereinbelow referred to as "Ic") chip to test its lifetime and reliability before sending out goods. For the purpose of the test a chip targeted is put into an abnormally loaded condition of high temperature and high voltage. Such a test configuration is called burn-in test.

There is a well-known technology of the burn-in test as shown in FIG. 1 in the prior art in which the status of the chip to be tested is an encapsulated chip packaged with molding compound through a molding process. Burn-in socket shown in FIG. 1 consists of a plurality of socket holes 14 in whitest a plurality of lead pins 12 of assembly 10 are inserted to electrically contact therewith, a plurality of socket pins 16 composed of metal and electrically contacted with the socket hole 14, and body 15 which accomodates the assembly 10 and in which the socket pins are established downward. For the burn-in test, the burn-in socket accommodating the assembly 10 targeted is mounted on a burn-in board (not shown) by the socket pins 16 and then test signal is applied into the IC chip of the assembly 10 in the abnormally extremity condition of higher temperature and voltage than that of a normal operating condition. An IC chip incapable of end during the test gets around to being failed as destruction of gate oxide film and thereby is regarded to as an inferior chip to be abandoned.

However, the configuration of the conventional built-in test just can be adaptable to one assembly which is encapsulated, but not to a bare chip, resulting in the Baste of the cost for packaging such an inferior chip.

In a recently proposed and advanced integrated technology multi-chip module (abbreviated to "MCM"), useful to increase the operating speed, integrating density and size, employing a flip chip in which a plurality of bare chips are mounted on a board by means of face-down bonding method, it is rigorously important to secure sufficient known-good dies (abbreviated to "KGD") those are bare chips tested so that there have been no defects (See PROJECT RETORT of MICROELECTRONICS AND COMPUTER TECHNOLOGY Co., published on October, 1992). The MCM, however, also has a problem incapable of manufacturing the KGDs of low cost because a bare chip without pins as the assembly of FIG. 1 cannot be tested by using the conventional burn-in socket as shown in FIG. 1.

To overcome the limitation is disclosed in U.S. Pat. No. 5,006,792 to provide the flip chip test socket adapter as shown in FIG. 2A for performing the burn-in test in the status of bare chip in which a plurality of solder bumps are formed on its pads. The flip chip of FIG. 2A as the IC chip 22 having solder bumps 24 on its bonding pads are inserted into the test socket adapter as shown in FIG. 2B to be tested in the burn-in mode. The test socket adapter includes the substrate 28 on which the cantilever beams 26 are formed. Also on the substrate 28 the guide bar 25 is established to support the IC chip 22 inserted and to adjust the alignment between the solder bumps and the cantilever beams 26. The substrate 28 is accommodated within the case 20. A plurality of socket leads 23 connected to a test board (not shown) through the case 20 are electrically connected to the cantilever beams 26. The elastic plate 30 is attached under the cover 29 at the top of the case 20 to make the IC chip 22 be well contacted with the cantilever beams 26 by pushing the back side of the IC chip 22 with elastic pressure by itself. However, in the conventional configuration, very expensive equipment is necessary to precisely form the solder bumps on the bonding pads of the IC chip in which the pitch between the bonding pads is very fine as an microscopic dimension, resulting in a KGD of high cost. Moreover, the cantilever beams should be changed to another type corresponding to another IC chip or the position of the bonding bumps and its metal of material is flexible to cause the life time of test socket adapter to be shorten. In addition, the back side of the IC chip is physically damaged due to the elastic plate which pushes the IC chip down to enhance the electrical contact with them.

SUMMERY OF THE INVENTION

Accordingly, it is an object of the invention to provide an apparatus capable of performing a reliable burn-in test of an IC chip which is advantageous to lower the whole cost for an IC product.

It is another object of the invention to provide an apparatus capable of performing burn-in tests with various IC chips.

It is another objects of the invention to provide an apparatus capable of testing an IC chip without solder bumps on its bonding pads.

It is a further object of the invention to provide an apparatus capable of performing the burn-in test without damaging a surface of an IC chip.

It is a further object of the invention to provide a burn-in test method which is advantageous to the whole cost of for an IC product, and adaptable to various IC chips which do not have solder bumps and without damaging on a surface of an IC chip.

An apparatus according to the invention comprises: a socket body including an accommodation groove in which an integrated circuit chip is accommodated to be tested; a stepped sill portion formed around the accommodation groove; a plurality of inner leads formed on the step sill portion; a plurality of outer leads protruded from the socket body and electrically connected to said inner leads through the socket body; and a supporting element attached to opposite inside walls of the accommodation groove to support the integrated circuit chip.

And in a test method with the apparatus according to the invention, which comprises the steps of: (a) mounting an integrated circuit chip to be tested in the accommodation groove; (b) bonding pads of the integrated circuit chip with the corresponding inner leads through a plurality of wires; (c) mounting the socket body on a test board by the outer leads and applying test pattern signals to the integrated circuit chip through the inner and outer leads in the condition of high temperature and high voltage; and (d) severing and removing the wires.

The foregoing and other objects, features and advantages of the invention will be apparent from the following and

DETAILED DESCRIPTION OF THE PREFERRED EMBODIMENT

Figure 1:
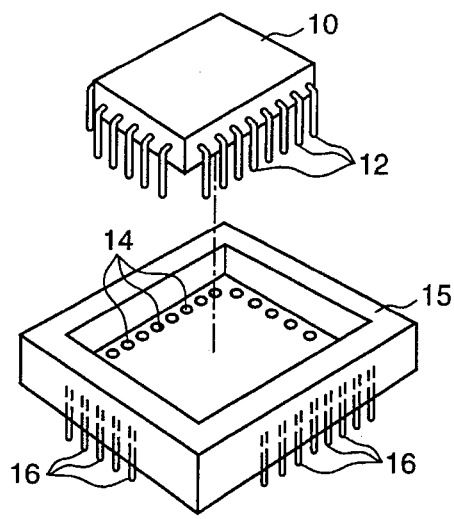
FIG. 1 is a schematic diagram of a conventional burn-in socket for performing burn-in test.
Figure 2A:
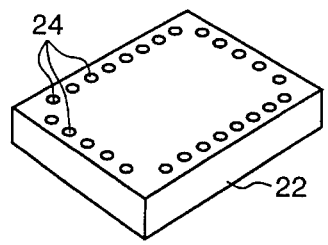
FIG. 2A is a perspective view of a conventional flip chip.
Figure 2B:
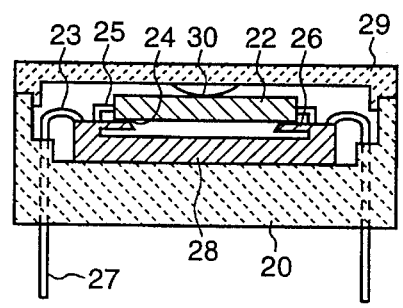
FIG. 2B is a front elevation sectional view of a conventional test socket adaptor on which the flip chip of FIG. 2A is being mounted.
Figure 3:
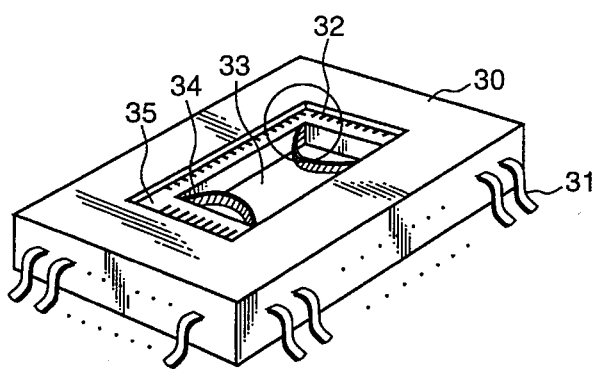
FIG. 3 is a schematic diagram of a burn-in socket according to an embodiment of the invention.
Figure 4:
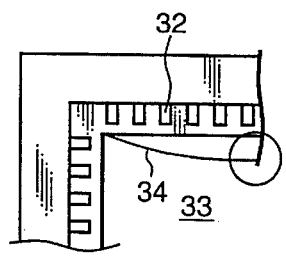
FIG. 4 is an enlarged schematic view of a part of step sill portion shown in FIG. 3.
Figure 5:
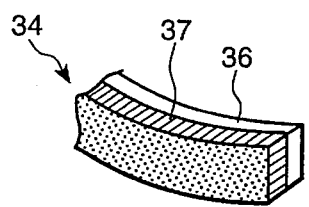
FIG. 5 is an enlarged schematic view showing detail structure of elastic portion shown in FIG. 4.

Referring to FIG. 3, the burn-in socket according to an embodiment of the invention has the socket body 30 including the accommodation groove 33 in which an IC chip to be tested is inserted therein. The socket body 30 may be composed of ceramic or plastic. On the opposite inside walls of the accommodation groove 33 a pair of the elastic elements 34 are attached to support in IC chip by pushing the side surface of the IC chip. Around the accommodation groove 33 are formed the step sill portion 35 on which a plurality of inner leads 32 are arranged, as shown in FIG. 4 which is the enlargement of the encircled portion of FIG. 3, to be connected with bonding pads of an IC chip through bonding wires for burn-in test. The outer leads 31 protruded toward the outside of the socket body 30 electrically connects the inner leads to a test board (not shown). The elastic element 34, as shown in FIG. 5, is a plate spring consisting of the steel plate 36 and teflon plate 37 that is provided to protect the damage of the side surface of the target chips from some physical damages.

Figure 6A:
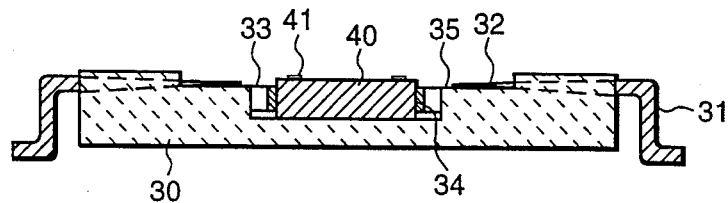
FIG. 6A to 6E show schematic views illustrating a burn-in test method according to an embodiment of the invention.
Figure 6B:
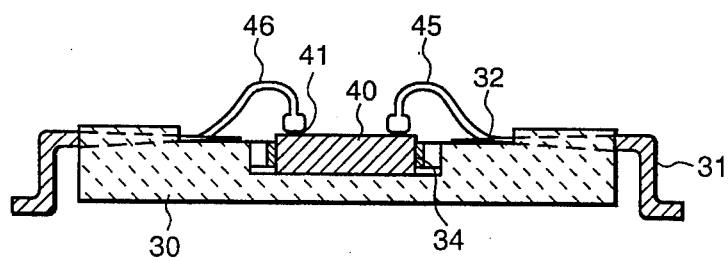

Then, the sequential flow of the present test method with the burn-in socket aforementioned and shown in FIG. 3 to FIG. 5 will be explained in detail. Referring to FIG. 6A, the IC chip 40 having a plurality of pads 41 formed on its surface is mounted into the socket accomodation groove 33 and fixed therein by the elastic force of the elastic element 34. Next, in FIG. 6B, the pads 41 of the IC chip 40 are connected to the corresponding inner leads 32 through the bonding wires 45 by means of a well-known thermocompression bonding process. It would be desirable for the material of the bonding wires 45 to employ a material which is conductive, and adaptable to the pads 41 and the inner leads 32 in the bonding process or supersonic wave bonding process, such as aluminum. The bonding wire is provided for the purpose of electrical connection between the pads 41 and test pattern signal generating circuit (not shown), and will be removed after the test is over. If the wire bonding has been completed, the socket embedding the IC chip is mounted on a burn-in test board (not shown) for the test. It should be noted that it is available for the apparatus according to the invention to execute not only the burn-in test but also a DC and AC tests, and a function test, etc. The IC chip in which defects have occurred during the test is treated as an inferior chip.

Figure 6C:
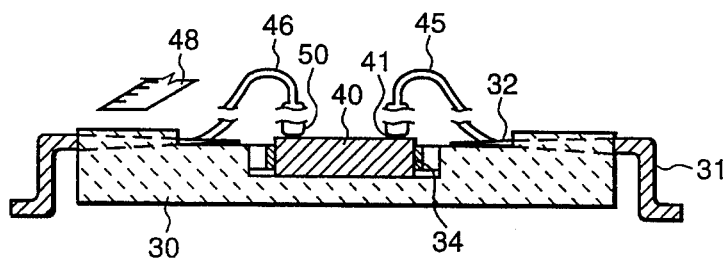
Figure 6D:
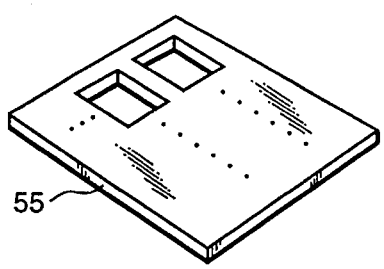

After the test has been finished, the bonding wires 45 only for the use of the test are cut away as shown in FIG. 6C. In FIG. 6C, the cutting tool 48 which has a sharp-edged blade of diamond-coated tungsten carbide and is fixed to an arm (not shown) which can move in three dimensions severs the ball portions 46 of the bonding wires 45 and the wedge portions 47 of the inner leads 32. The cutting tool 48 simultaneously cuts the ball portions 46 dee the bonding wires 45 and the wedge portions 47 of the inner leads 32 away by moving to the direction of left or right taken along with positions near to the surface of the socket body 30. The remaining wire balls 50 may be usable as bumps because of its own flatness. The height of the remaining wire balls 50 to be used as bumps can be controlled by means of adjusting a pitch between the surface of the socket body 30 and the blade of the cutting tool 48. The severed wires are blown off by an air shower and then the IC chip 40 is transferred to the chip Carrier 55 as shown in FIG. 6D.

Figure 6E:
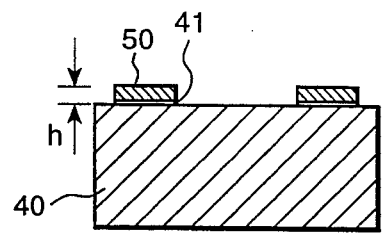

FIG. 6E shows an IC chip tested as one having no defects, that is the KGD, in which the height h of the bump 50 may be desirable to be in the range of 5 to 25 micrometers. Since the bump 50 has a flattened surface, it is possible, if necessary, to repeat another wire bonding process on the bump 50.

As previously mentioned, it is within the contemplation of the invention not only to provide an test apparatus which is advantageous to whole cost of an IC product because of a reduction of the test operation with a bare chip, an accomplishment of the test function without the preliminary formation of bumps on an IC chip and a security of an IC chip to be tested, but also to provide a test method using the apparatus which is advantageous to whole cost of an IC product because of a performance ability of the test without further process or equipment added to the existing process or equipments. The apparatus and method according to the invention can be adaptable to IC chips employed in a personal computer as well as the MCM and an ASIC module due to the low cost for the KGD.

The invention may be embodied in other specific forms without departing from the spirit or essential characteristics thereof. The present embodiment is therefore to be considered in all respects as illustrative and not restrictive, the scope of the invention being indicated by the appended claim rather than by the foregoing description and all changes which cone within the meaning and range of equivalency of the claims are therefore intended to be embraced therein.

What is claimed is:

1. An integrated circuit chip testing method using a test socket comprising:

a socket body including an accommodation groove and a sill portion provided around the accommodation groove, the accommodation groove being constructed and arranged to temporarily receive an integrated circuit chip to be tested, the integrated circuit chip having a plurality of pads formed thereon;

a plurality of inner leads provided on the sill portion;

a plurality of outer leads extending from the socket body and being electrically connected to respective inner leads; and a chip support constructed and arranged to positionally fix the integrated circuit chip within the accommodation groove;

the testing method comprising the steps of:
 positionally fixing an integrated circuit chip in the accommodation groove;

electrically connecting each pad on the integrated circuit chip to a respective inner lead with a corresponding wire, including ball bonding each corresponding wire to a respective pad, thereby forming a conductive ball portion on each pad;

connecting the outer leads to a test board;

applying test signals to the integrated circuit chip via the inner and outer leads while exposing the integrated circuit chip to a test temperature and a test voltage; and after said step of applying test signals, severing each corresponding wire at the ball portion formed on each pad, thereby forming a corresponding connection bump on each pad.

2. A testing method according to claim 1, wherein said step of electrically connecting is performed by at least one of a thermo-compression process and a supersonic wave process.

3. A testing method according to claim 1, wherein said step of severing each corresponding wire comprises severing each ball portion formed on each pad with a cutting tool, whereby each connection bump formed by severing each ball portion has a substantially flat surface.

4. A testing method according to claim 3, wherein said step of severing is performed using a cutting tool comprising a cutting blade mounted on an arm which can move in vertical and horizontal planes.

5. A testing method according to claim 4, wherein said step of severing is performed using a diamond-coated tungsten carbide blade mounted ion the arm.

6. A testing method according to claim 3, wherein said step of severing includes adjusting a location above the integrated circuit chip where the corresponding wire is severed, thereby permitting adjustment of the height of the resultant connection bump.

7. A testing method according to claim 1, wherein said step of severing includes adjusting a location above the integrated circuit chip where the corresponding wire is severed, thereby permitting adjustment of the height of the resultant connection bump.

8. A testing method according to claim 1, wherein the chip support includes opposing resilient members provided in the accommodation groove, wherein said step of positionally fixing the integrated circuit chip in the accommodation groove includes inserting the integrated circuit chip into the accommodation groove so as to flex the opposing resilient members, thereby creating a resilient force on the integrated circuit chip which fixes the integrated circuit chip within the accommodation groove.

9. A testing method according to claim 8, wherein the opposing resilient members are steel plate springs coated with polytetrafluoroethylene.

10. A testing method according to claim 1, wherein the socket body is made from at least one of a ceramic and a plastic.

* * * * *